United States Patent [19]
Vogt et al.

[11] Patent Number: 5,162,978
[45] Date of Patent: Nov. 10, 1992

[54] FRAME SUPPORT FOR SLIDING PRINTED CIRCUIT BOARDS

[75] Inventors: William R. Vogt, Rockaway; Leonard Noonan, Stanhope, both of N.J.

[73] Assignee: Baker Industries, Inc., Parsippany, N.J.

[21] Appl. No.: 696,479

[22] Filed: May 6, 1991

[51] Int. Cl.$^5$ ............................................. H01R 23/68
[52] U.S. Cl. ..................................... 361/413; 211/41; 312/223; 361/399; 361/415
[58] Field of Search .......................... 211/41; 248/27.1; 312/223, 308, 330; 361/391, 394, 395, 399, 413, 415, 420, 427; 439/64, 65, 326

[56] References Cited

U.S. PATENT DOCUMENTS

| | | | |
|---|---|---|---|
| 2,928,555 | 3/1960 | Childs et al. | 361/391 |
| 3,147,404 | 9/1964 | Sinner | 361/391 |
| 3,188,524 | 6/1965 | Williams | 361/391 |
| 3,320,488 | 5/1967 | Karew et al. | 361/391 |
| 3,368,117 | 2/1968 | Pond et al. | 361/391 |
| 3,755,716 | 8/1973 | Yoshii et al. | 361/391 |

FOREIGN PATENT DOCUMENTS

| | | | |
|---|---|---|---|
| 3300066 | 7/1984 | Fed. Rep. of Germany | 361/415 |
| 2477828 | 9/1981 | France | 439/64 |
| 0158068 | 6/1990 | Japan | 439/135 |
| 1256250 | 9/1986 | U.S.S.R. | 361/391 |

Primary Examiner—Leo P. Picard
Assistant Examiner—D. Sparks
Attorney, Agent, or Firm—James J. Jennings

[57] ABSTRACT

A mounting frame for supporting several printed circuit boards in abutting relationship includes a pair of side frame members. At least some of the printed circuit boards have slots along or near the side edges, through which screws extend into the side frame members. The screw heads extend over and retain the printed circuit boards in position. When the screws are loosened for some of the boards, those boards can be displaced from each other but not removed from the frame. Additional loosening of one set of screws allows the removal of that one board, even if that board is not the last board in the run of boards. Cylindrical bores are provided in at least one of the side frame members to afford pivotal mounting of the frame-and-card set in an enclosure. When the frame-and-card assembly is pivoted outwardly, an additional set of cards can be mounted on the back of the frame. Cylindrical stand-offs are provided in the back of the enclosure, so that upon rotation of the frame assembly, electrical connection is made through banana plugs which extend between the frame side member and the stand-off.

22 Claims, 4 Drawing Sheets

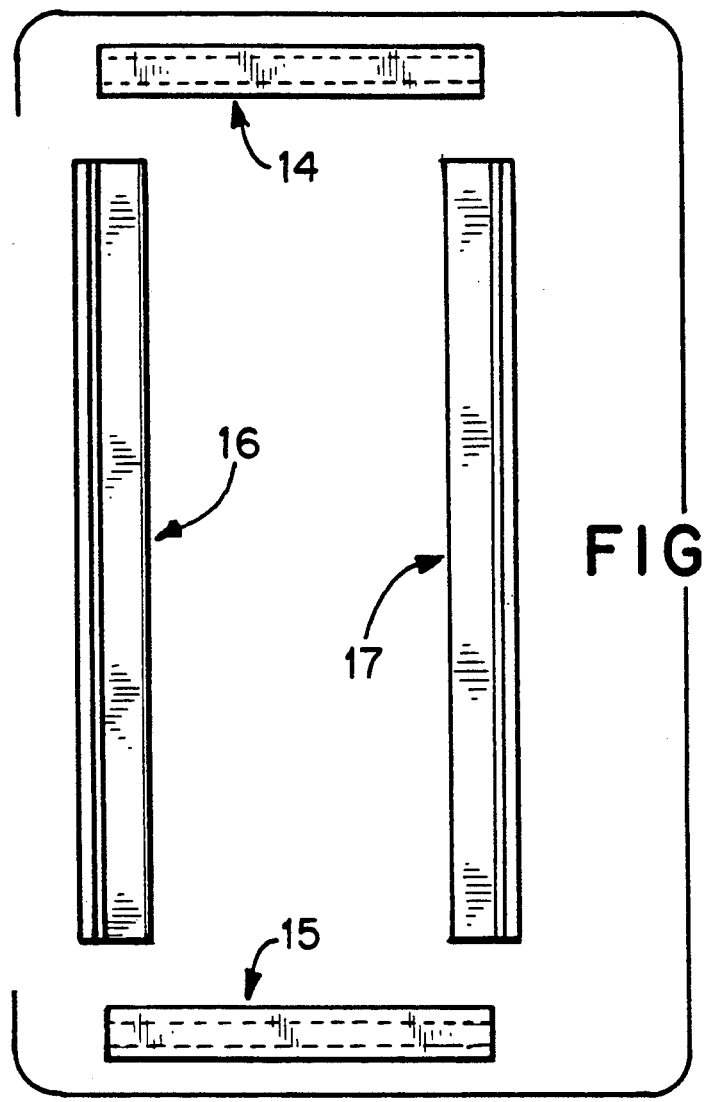
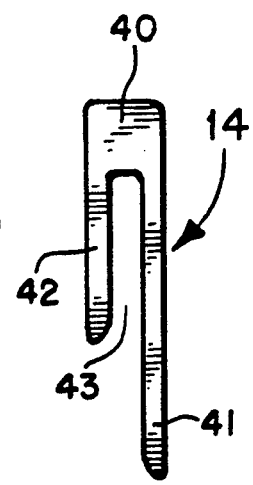
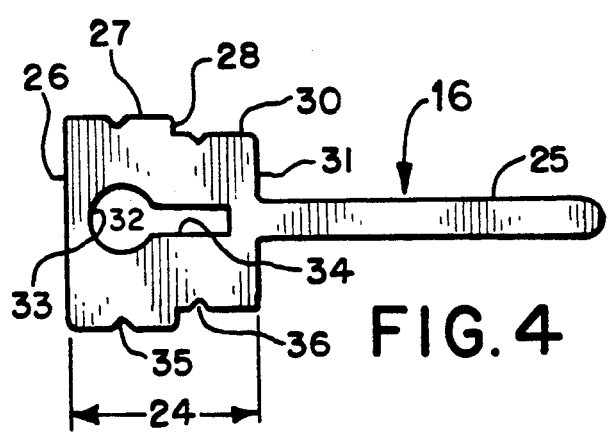
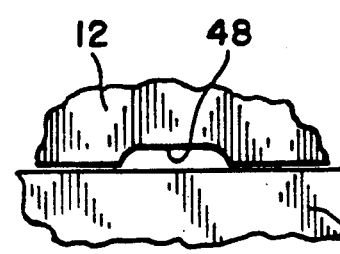
FIG. 3
FIG. 4
FIG. 5
FIG. 6

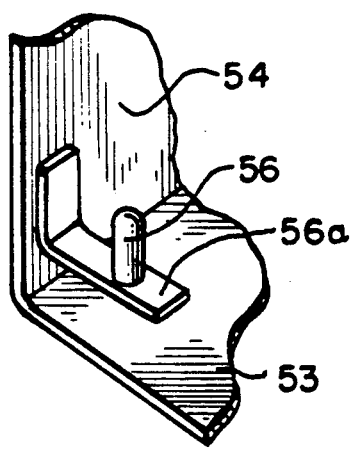
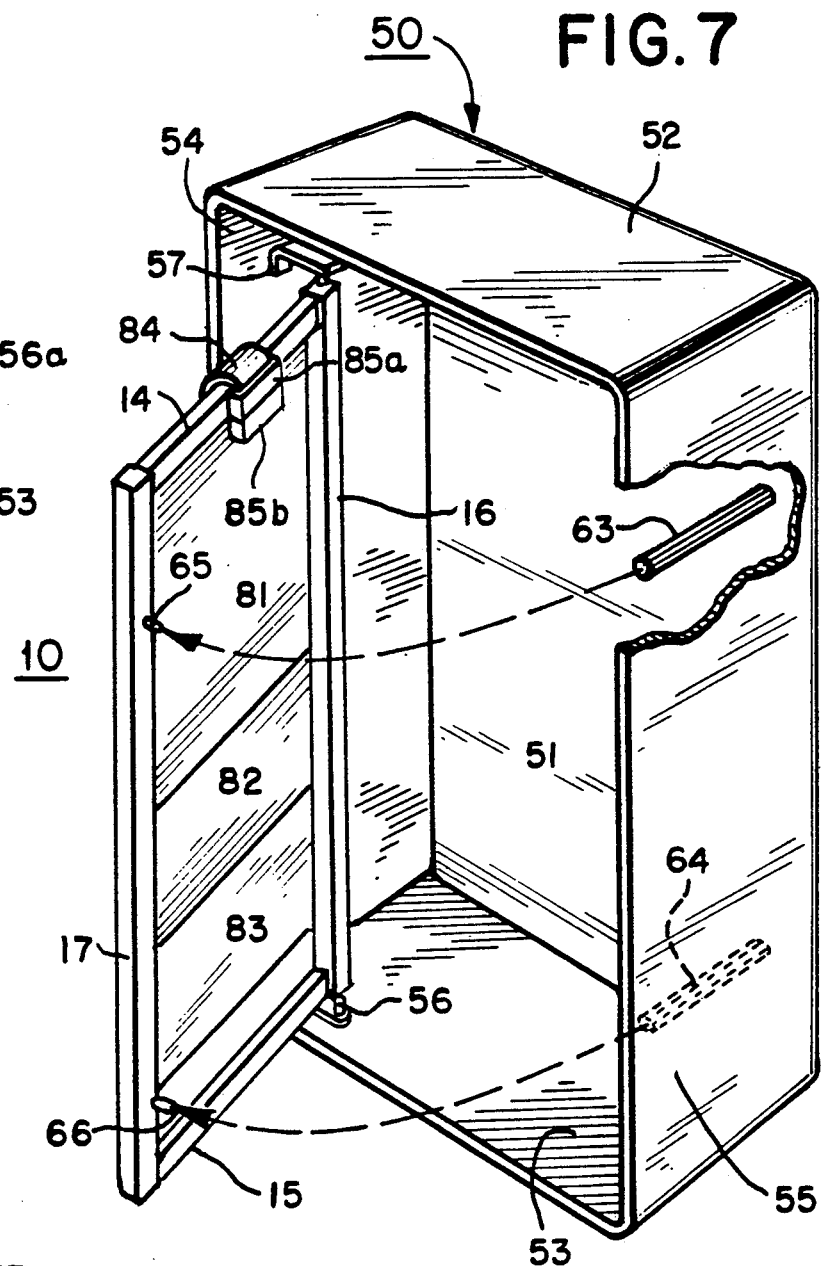
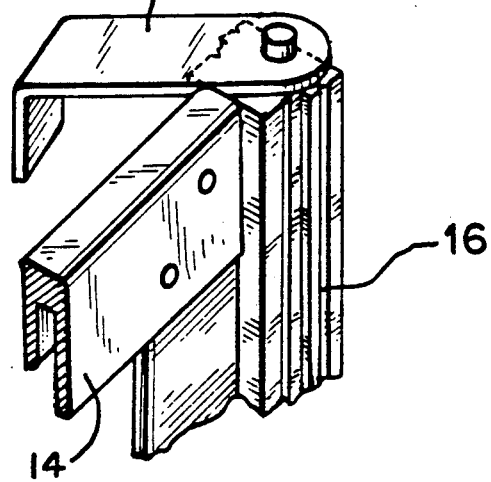
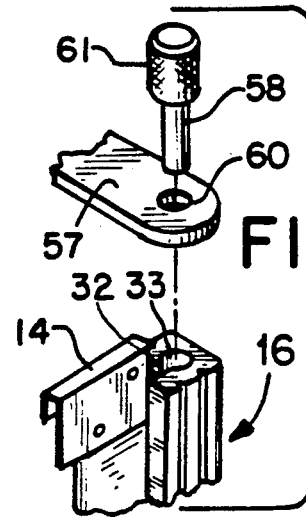

FRAME SUPPORT FOR SLIDING PRINTED CIRCUIT BOARDS

BACKGROUND OF THE INVENTION

The present invention is particularly directed to a generally rectangular frame or support platform for a plurality of printed circuit boards. In particular the invention is directed to such a support arrangement which greatly facilitates the removal of one circuit board or card when two or more such cards are assembled in abutting relationship, so that even a card inside two adjacent circuit boards can be removed without necessitating the removal of either of the adjacent circuit boards.

Various electronic systems are assembled in modular form, with several sub-systems, the power supply, and input and output portions on a plurality of printed circuit boards, frequently termed "cards". In the electronic system arrangement technology, very often components are assembled on or in a rack arrangement which has a pair of vertical bars at the front. Sub-systems or components are then mounted to the two front bars, and often interconnected by relatively short connectors at the back or sides of the assembly. This is analogous to the mounting or stacking of a plurality of sub-systems for a home audio arrangement, such as a receiver, amplifier, tape deck, equalizer, and so forth. When lightweight materials such as printed circuit cards with miniaturized components thereon are assembled to the front of a rack, often the first or major sub-system is on the larger card, and it is assembled first by screws or other fasteners at the top of the support structure. The second card is then assembled just under the first, often by pushing it downwardly so that connectors can be mated to intercouple circuits on the two boards. The second card is then fastened by screws or similar fasteners after it is placed in abutting, electrically coupled contact with the first card.

A third card and other cards can then be added in the same manner, so that each is placed to abut the last-fastened card, and is then itself fixed in place by using screws which pass through the card edges and into correspondingly tapped apertures in the supporting bars.

The difficulty encountered with this system arrangement is that, if three cards are fixed in place in this way, and it is desired to remove the second card from between the first and third, the third card must first be entirely removed from the rack before the second can be removed. After changes or repairs are made to the second card, it can then be re-inserted, and the third card replaced in the original arrangement. However if it is only necessary to remove the second card, it is highly desirable that some method or arrangement be provided to allow this removal without necessitating the removal of an additional card or cards from the system.

SUMMARY OF THE INVENTION

The present invention entails a mounting platform for supporting a plurality of printed circuit boards in abutting relationship. Each of the boards has at least one slot on each of its opposing edge portions which are used for fastening, and which do not abut the adjacent board or boards. The mounting platform defines two series of parallel apertures spaced apart by a distance approximately the width of the printed circuit boards. After the boards are placed on the mounting platform, a plurality of fasteners are utilized to extend through the circuit board slots into the apertures, thus retaining the printed circuit boards on the mounting surface. This arrangement allows a pair of fasteners to be loosened, allowing the loosened board to be displaced vertically sufficiently enough to allow removal of the second board, without necessitating removal of the third board from the assembly.

In accordance with another aspect of the invention, the mounting platform defines a cylindrical bore near one edge. Simplified pivotal mounting of the platform is provided by a hinge pin fixed to the system enclosure, and a second, removable hinge pin. This pivotal mounting allows access, when the platform is swung outwardly, either to the rear of the circuit boards or, when another board (or boards) is mounted on the rear of the mounting platform, to the front of that board or those boards.

THE DRAWINGS

In the several figures of the drawings, like reference numerals identify like elements, and in those drawings:

FIG. 3 is an exploded view of the main components of the mounting platform or rectangular frame, before those components are assembled into the platform;

FIGS. 4 and 5 are sectional views, taken on a scale enlarged with respect to FIG. 3, showing construction details of the components which are assembled into the rectangular frame of the invention;

FIG. 6 is a front view of a portion of two abutting circuit cards, illustrating another feature of the invention;

FIG. 7 is a perspective view showing generally the pivotal mounting of the rectangular frame assembly;

FIGS. 7A, 8 and 8A are detail views further depicting the frame mounting shown in FIG. 7.

DETAILED DESCRIPTION OF THE INVENTION

Figure 1:
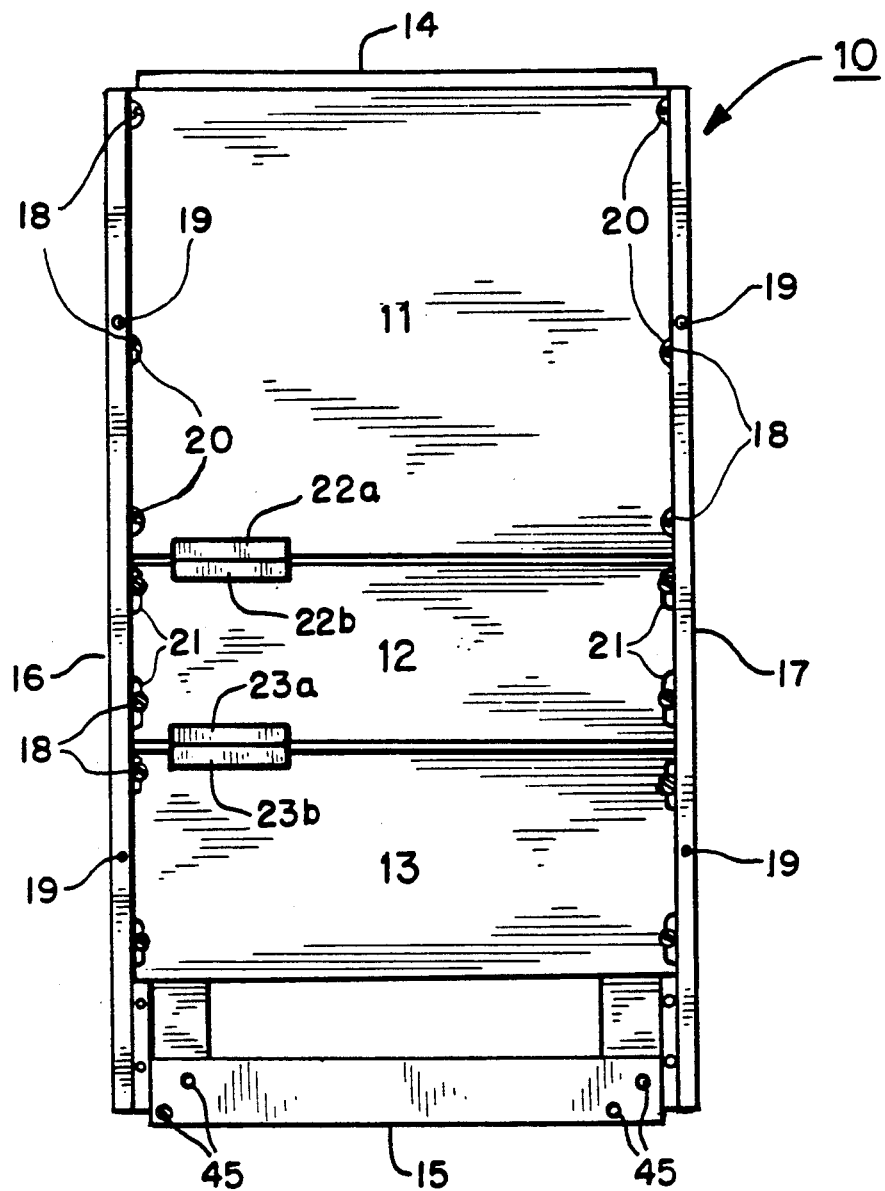
FIG. 1 is a front view of an assembly including the mounting platform of the present invention and a plurality of printed circuit boards mounted thereon.

FIG. 1 depicts the support platform or frame 10 of the present invention. In the illustrated embodiment three separate printed circuit boards 11, 12, and 13 are mounted on the support rack 10. The support rack or platform is comprised of four individual components including an upper horizontal member 14, a lower horizontal member 15, and a pair of vertical or side members 16 and 17. The individual construction, and subsequent mating, of the members 14–17 will be described below. The several circuit boards or cards are secured by respective fastening screws 18 to the vertical members 16 and 17, so that they are supported on frame 10. Along the left and right edges of the uppermost card 11 are a plurality of semi-circular edge slots 20. These slots are sized so that the head of one of the fastener screws 18 when it enters the correspondingly tapped recess (not visible in this view) in the support member, will extend over the adjacent portion of printed circuit board 11 and thus retain the board in position on the rack. Thus the slots 20 are sized to accomodate the diameter of the screw portion of the fasteners 18, which is less than the diameter of the head portion of these fasteners.

Figures 2A, 2B:
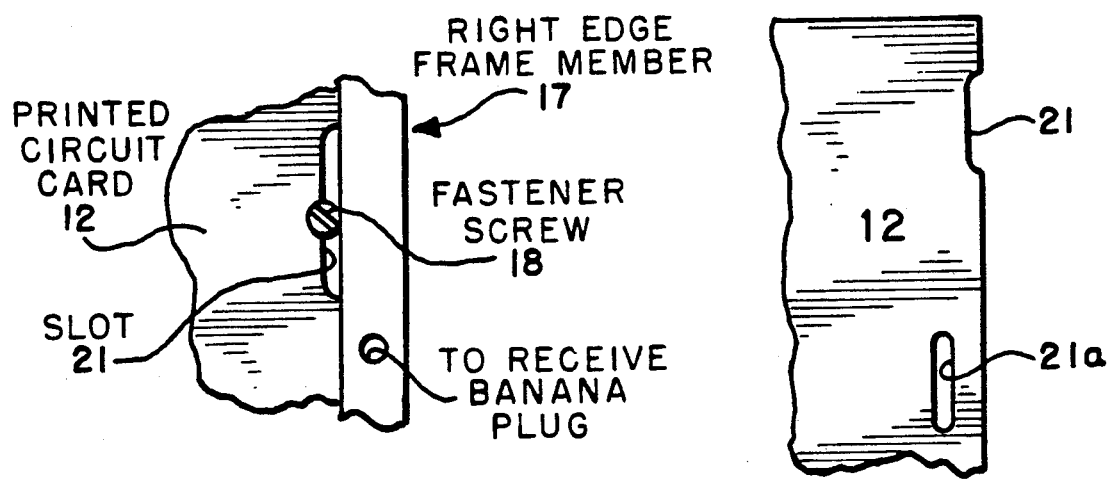
FIG. 2A is an enlarged view of a segment of FIG. 1, useful in understanding the invention.
FIG. 2B is a segment view similar to that of FIG. 2A, but showing an alternate construction.

In accordance with an important feature of the present invention, the second circuit board 12 has its edge portions shaped to define a plurality of slots 21. As better shown in FIG. 2A, each slot 21 has a vertical extent considerably greater than that of the slots 20 on circuit board 11. In FIG. 2A slot 21 is sized to accommodate the threaded portion of fastener screw 18, so that the head of the fastener screw extends over and thus retains printed circuit card 12 in position when fastener screw 18 is inserted and screwed into its correspondingly tapped recess (not visible). The vertical extent of slot 21 is made equal to the distance the card must move, plus the diameter of fastener screw 18, to accommodate the "sliding" or vertical displacement of this card to simplify the removal of this card or an adjacent card.

When the cards or circuit boards 11, 12 and 13 are placed in the positions shown in FIG. 1, electrical connections are made between components (not shown) on boards 11 and 12 by virtue of the connectors 22a and 22b. One of the connectors includes a series of male connectors which are received in corresponding receptacles in the other, to effect the electrical interconnection between these boards. In the same way electrical connections between boards 12 and 13 are made through the connectors 23a and 23b. Accordingly when the screws 18 are loosened and the cards displaced from each other, the electrical interconnections are broken as the connectors 23a and 23b are separated, and the connectors 22a and 22b are separated.

FIG. 2B shows an alternate construction for the slot in the side of printed circuit card 12. Slot 21 is the same as that shown in FIG. 2A, but in FIG. 2B another slot 21a is shown, spaced a slight distance from the edge of printed circuit board 12. It is possible to provide the tapped recesses (not shown) further inboard from the locations shown in FIG. 1, and have the mounting screws 18 pass through the respective slots 21a into the mating tapped holes. Slightly loosening the fastening screw allows the board to be displaced vertically by an extent equal to the vertical dimension of the slot 21a. At the present time the construction depicted by the slot 21 is the preferred construction. From the foregoing it is evident that the use in the appended claims of terminology describing a slot on an "edge portion" or on "opposing edge portions" embraces the construction of both slots illustrated in FIG. 2B.

FIG. 3 depicts the four major components of the mounting rack 10 in the preferred embodiment, before they are assembled to complete the mounting platform. Each of the opposed side frame members 16 and 17 is shaped as shown in section in FIG. 4. Member 16 includes a base portion 24 and a tongue portion 25. Base 24 includes an end wall surface 26, a first land portion 27 extending at right angles to surface 26, a shoulder 28 which connects land 27 with a second land portion 30, and another connector portion 31 which extends from land 30 to tongue 25. The other outer portion of base 24 is identical, as member 16 is symmetrical about its center line.

Member 16 has a portion of the base cut out in the shape of a keyway 32. This keyway includes a generally circular portion 33 and a rectangular extension 34. One reason for the material removal is to save money, as member 16 is made of aluminum in the preferred embodiment. More importantly, circular cut-out portion 33 defines a receptacle for a pivot rod (not shown), as will be explained later, which facilitates mounting of the assembly 10 and its swivelling around a reference point both to allow inspection of connections and/or components on the rear surface of cards 11, 12 and 13, or inspection of other cards mounted on the reverse side of mounting rack 10, and to allow access to other components (such as batteries) which might be situated behind the boards.

In FIG. 4 groove 35 in the base portion is a drill guide. Such a groove is placed on the base in two places on each side, to provide a reference for subsequent drilling and tapping to provide the recesses 19 shown in FIG. 1. The other groove 36 shown in FIG. 4 is another drill guide, which is provided on base 24 at 17 different locations, or as many locations as suitable for a particular application. When the drilling and tapping are completed, apertures are produced to receive the fastener screws 18 for securing the circuit boards 11, 12 and 13 in place as already described. The provision of the recesses, accurately located by the grooves 36, defines the appropriate distance from shoulder 28 to very accurately position the edge of each printed circuit board on the land portion 30 of member 16. While the grooves 35, 36 are not necessary to practice of the invention, they facilitate the production and thus save time and money in the overall construction and assembly.

FIG. 5 shows in section the structure of top member 14 of the platform assembly, which member is exactly the same as the lower member 15. As there shown, member 14 includes a base 40, a first leg portion 41 and a second leg portion 42. The member 14 can be considered U-shaped or J-shaped, when viewed in section. In this specification and in the appended claims, the phrase "generally U-shaped" includes members 14 where the legs are not equal in length. It is not necessary for the leg 42 to be significantly shorter than the leg 41, but it makes it easier to assemble the separate members into the complete rack 10. The legs 41,42 with base 40 define a central slot 43, of the appropriate dimension to receive tongue 25 of side members 16 and 17. Considering FIG. 3, when top member 14 is moved downwardly and the tongues 25 of each of the side members 16 and 17 received into slot 43, and the same sliding movement of member 15 is used to enclose the lower tongue portions of members 16, 17, a good, rigid frame structure is provided. In the preferred embodiment, one or more welds or screw fasteners are used in each corner to maintain the rigidity and integrity of the resultant frame. FIG. 1 shows two pairs of fastening screws 45 used to secure the four members in position.

FIG. 6 depicts another enhancement of the invention. As there shown, a slot 48 is provided in the horizontal abutting edge of printed circuit board 12, in a manner similar to the way that slot 21 is provided in a vertical edge (FIG. 2B). After the fastening screws 18 are loosened, to slide cards 12 and 13 with respect to each other the tip of a screwdriver (not shown) can be inserted in slot 48 and the screwdriver rotated to effect a vertical relative displacement between these printed circuit boards and disengage the connectors 22a and 22b. Two or more slots 48 can be provided if necessary, but two slots, one near each vertical edge, allow for easy separation and displacement of the cards relative to each other after the fastening screws are loosened.

FIG. 7 depicts mounting details of the mounting frame 10 into an electrical housing or enclosure 50. Housing 50 includes a back wall 51, top and bottom panels 52 and 53, and side walls 54, 55. As better seen in FIG. 7A, on bottom bracket 56a attached to side wall 54, a cylindrical pin 56 is fixed, either by welding or use of a fastener (not shown). This provides a reference location at which pin 56 is received in circular bore 33 (see FIG. 4) of keyway 32 in the left member 16. After frame assembly 10 is dropped downwardly so that the bore 33 is seated on pin 56, mounting bracket 57 and a hinge pin 58 are used to complete the pivotal mounting.

As shown in FIG. 8, the horizontal portion of bracket 57 defines an aperture 60 sized to receive the cylindrical pin 58, which has a head portion 61 of a diameter greater than that of bore 33 in keyway 32. The assembly 10 is aligned and the hinge pin 58 dropped downwardly through aperture 60 and seated in the circular portion 33 of the keyway, thus retaining the frame-and-circuit boards in the position shown in FIG. 7. This allows the frame or rack 10 to pivot about an axis concentric with bore 33 in member 16.

An important technical advantage accrues from this pivotal mounting. When the rack-and-card assembly is swung out from enclosure 50, to the position shown in FIG. 8A, interference between bracket 57 and top member 14, at the full open position, prevents the printed circuit boards from hitting side wall 54. Another set of printed circuit boards 81, 82 and 83 can be mounted on the back side of frame 10. A conventional cable connector 84 is used to couple circuit board 11, on the front of frame 10, to board 81 mounted on the back of the frame. Ribbon connector 84 is terminated (on the end visible in FIG. 7) in connector 85a, which mates with connector 85b on printed circuit board 81. This doubles the board mounting capacity of this frame arrangement as compared to prior art devices which allow front-only mounting.

Another feature of the invention is the means for securing assembly 10 into position after it is pivoted to be parallel to back panel 51. Toward this end a pair of cylinders 63, 64 are provided and positioned as shown, each having a central bore for accommodating a fastener. The elements 63, 64 are secured to the back panel 51 by suitable fastening screws (not shown) which pass through back panel 51 and are received into correspondingly tapped portions of the cylinders 63, 64. A pair of compressible electrical connectors 65, 66 are provided; these connectors are generally termed "banana plugs" in this industry. One end of each of these two banana plugs is inserted into the corresponding apertures 19 along the edge of member 17 (see FIG. 1). When the frame 10 is pivoted toward the "closed-door" position, the protruding end of each of the banana plugs 65, 66 is snugly received into the bores of cylinder 63, 64, securing the assembly 10 in place. Not only is the mechanical position thus secured, but there is a very effective electrical contact made for the ground connection of the circuit boards, through the banana plugs and the cylinders to the enclosure 50. This is another important feature of the present invention. Note that the banana plugs could have been mounted onto the cylinders 63 and 64, and received in corresponding apertures (not shown) in frame 10.

Figure 9A:
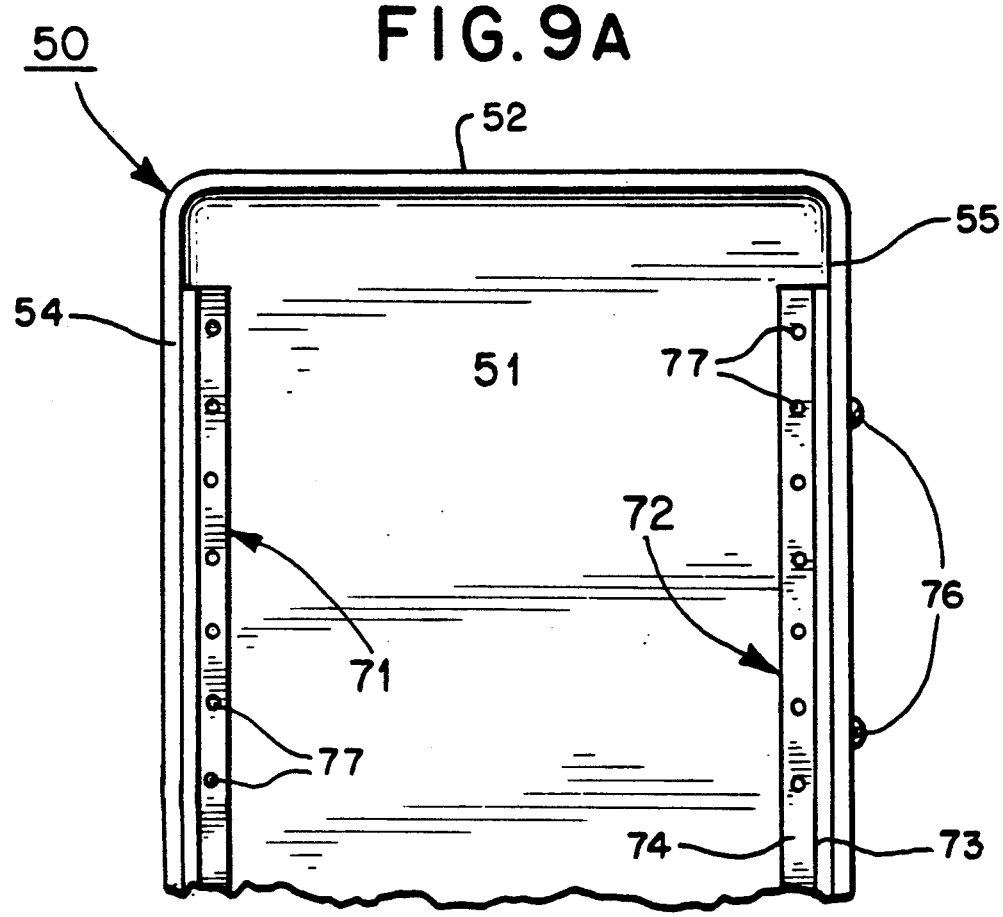
FIGS. 9A and 9B are partial front and perspective views, respectively, depicting another embodiment of a mounting platform for the invention.
Figure 9B:
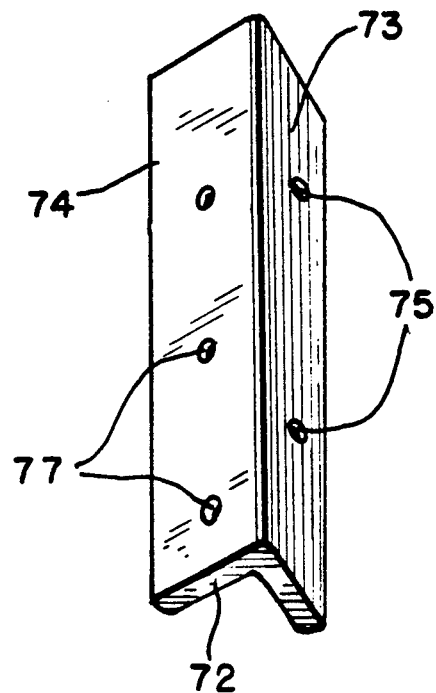

FIGS. 9A and 9B depict an embodiment of the invention which is useful when a pivotal mounting of the frame-and-card arrangement is not used. In this embodiment a pair of right-angled flange members 71 and 72 are fastened to the side walls 54, 55 of enclosure 50 as shown. These flange members 71, 72 can be considered analogous to members 16 and 17 in the preferred embodiment. FIG. 9B shows a portion of flange member 72, which has a base portion 73 and a flange extension 74 extending from the base at right angles. Apertures 75 are provided in base portion 73 so that mounting screws 76 can extend through apertures in side wall 55, through the aperture 75, and be fixed in place by nuts (not shown). Of course the flange members 71, 72 could also be welded or otherwise affixed to the side walls 54, 55. Flange extension 74 defines a plurality of tapped recesses 77 for receiving fastening screws 18. It is noted that this arrangement also provides a mounting platform, which in this case includes the enclosure 50, which defines a pair of generally parallel, spaced-apart mounting surfaces. Those mounting surfaces are on the flange extensions, such as the extension 74 shown in FIG. 9B. Those skilled in the art will appreciate that separate, individual flange members 71 and 72 need not be provided. Instead the side walls 54, 55 can be deformed so that cut-out portions are bent inwardly to form the right-angle extension to function as the flange elements 71, 72.

TECHNICAL ADVANTAGES

The present invention provides several advantages in the printed circuit board mounting technology. It allows for high density packing of the cards, placing them in abutting relationship and a back-to-back arrangement as well. It allows easy removal of a card from the center of an array on the mounting platform. The platform or rack itself gives good mechanical support for the plurality of printed circuit boards mounted on the frame. When the frame is assembled of four aluminum elements, there is an excellent electrical connection between these components, which provides part of a good grounding path from the ground connections of the printed circuit cards through the frame to the system ground. The provision of the cylindrical hole for the hinge pin in the mounting rack not only conserves material but also allows for easy mounting, and subsequent removal, of the frame from the system enclosure, as well as allowing the entire assembly to "swing" open—even while power is applied to the circuit boards. Use of the banana plugs and cylindrical connector tubes also serves to both mechanically secure the rack assembly in its closed position, and provide a very good electrical connection between the printed circuit boards and the enclosure of the system.

While only particular embodiments of the invention have been described and illustrated, it is apparent that various modifications and alterations may be made therein. It is therefore the intention in the appended claims to cover all such variations and modifications as may fall within the true spirit and scope of the invention.

What is claimed is:

1. The combination of a mounting platform and a plurality of printed circuit boards, which platform is configured to support the printed circuit boards in abutting relationship, wherein said mounting platform defines a pair of generally parallel, spaced-apart mounting surfaces, each circuit board has a first pair of opposing edge portions positioned to abut adjacent boards and a second pair of opposing edge portions which do not abut adjacent boards, each of the second pair of opposing edge portions defining at least one slot, and a plurality of fasteners extend through said slots into said mounting surfaces for retaining said printed circuit boards on the mounting surface in abutting relationship, at least one of said boards having its slots elongated and dimensioned to allow sliding displacement of that one board on the platform, for allowing removal of another one of the circuit boards upon loosening at least some of said fasteners to allow sliding displacement, but not removal, of said one circuit board.

2. The combination as claimed in claim 1, in which the mounting surfaces define two series of parallel apertures spaced apart by a distance approximately the width of the printed circuit boards, and said fasteners include screws extending through said slots into said apertures.

3. The combination of a mounting platform and a plurality of printed circuit boards, which platform is configured to support the printed circuit boards in abutting relationship, wherein said mounting platform defines a pair of generally parallel, spaced-apart mounting surfaces, each circuit board has a first pair of opposing edge portions positioned to abut adjacent boards and a second pair of opposing edge portions which do not abut adjacent boards, each of the second pair of opposing edge portions defining at least one slot, a plurality of fasteners extend through said slots into said mounting surfaces for retaining said printed circuit boards on the mounting surface in abutting relationship, at least one of said boards having its slots elongated and dimensioned to allow sliding displacement of that one board on the platform, for allowing removal of another one of the circuit boards upon loosening at least some of said fasteners to allow sliding displacement, but not removal, of said one circuit board, and further comprising a pair of mating electrical circuit interconnectors, one disposed on each of two abutting printed circuit boards, such that when those two boards are mounted and positioned in abutting relationship, the electrical circuit components on the respective boards are intercoupled through the mating connectors.

4. The combination of a mounting platform and a plurality of printed circuit boards, which platform is configured to support the printed circuit boards in abutting relationship, wherein said mounting platform defines a pair of generally parallel, spaced-apart mounting surfaces, each circuit board has a first pair of opposing edge portions positioned to abut adjacent boards and a second pair of opposing edge portions which do not abut adjacent boards, each of the second pair of opposing edge portions defining at least one slot, a plurality of fasteners extend through said slots into said mounting surfaces for retaining said printed circuit boards on the mounting surface in abutting relationship, at least one of said boards having its slots elongated and dimensioned to allow sliding displacement of that one board on the platform, for allowing removal of another one of the circuit boards upon loosening at least some of said fasteners to allow sliding displacement, but not removal, of said one circuit board, in which one of said circuit boards defines at least one additional slot, on an edge of the board which abuts an adjacent board, to allow insertion of the tip of a tool which, when rotated, displaces the adjacent circuit boards from the abutting relationship.

5. The combination as claimed in claim 1, and an enclosure for the platform, in which the platform is four sided and is not a part of the enclosure, and which platform has a side portion which, at its opposite ends, defines openings for receiving pins when the platform is mounted in the enclosure.

6. The combination as claimed in claim 1, in which the platform is comprised of a frame assembly fashioned by joining four separate members, two of which include base and tongue portions, and the other two of which define a central slot dimensioned to receive one of said tongue portions, and the frame assembly is completed by sliding the members together so that the respective slots engage the tongue portions of the other two members.

7. The combination as claimed in claim 6, in which two of said members have a portion defining a shoulder to locate the edges of one of the printed circuit boards.

8. The combination as claimed in claim 6, in which two of said members have a central portion bored to remove material therefrom and define a generally circular opening.

9. The combination as claimed in claim 6, in which one of said members defines at least one recess for receiving a compressible electrical connector.

10. The combination as claimed in claim 8, and an enclosure for said platform, a pin fixed within the enclosure and which pin is received in the circular opening of one platform member, a bracket fixed to a different surface of the enclosure, which bracket defines a circular opening, and a pin, extending through the bracket opening into the circular opening at the other end of said one platform member, to provide a pivotal mounting for the platform in said enclosure.

11. The combination of a mounting platform and a plurality of printed circuit boards, which platform is configured to support the printed circuit boards in abutting relationship, wherein said mounting platform defines a pair of generally parallel, spaced-apart mounting surfaces, each circuit board has a first pair of opposing edge portions positioned to abut adjacent boards and a second pair of opposing edge portions which do not abut adjacent boards, each of the second pair of opposing edge portions defining at least one slot, a plurality of fasteners extend through said slots into said mounting surfaces for retaining said printed circuit boards on the mounting surface in abutting relationship, at least one of said boards having its slots elongated and dimensioned to allow sliding displacement of that one board on the platform, for allowing removal of another one of the circuit boards upon loosening at least some of said fasteners to allow sliding displacement, but not removal, of said one circuit board, in which the platform is comprised of a frame assembly fashioned by joining four separate members, two of which include base and tongue portions, and the other two of which define a central slot dimensioned to receive one of said tongue portions, and the frame assembly is completed by sliding the members together so that the respective slots engage the tongue portions of the other two members, in which one of the two members having base and tongue portions has a central portion bored to remove material therefrom and define a generally circular opening, and an enclosure for said platform, a pin fixed within the enclosure and which pin is received in the circular opening of one platform member, a bracket fixed to a different surface of the enclosure, which bracket defines a circular opening, and a pin, extending through the bracket opening into the circular opening at the other end of said one platform member, to provide a pivotal mounting for the platform in said enclosure, in which a portion of one of said members defines at least one recess for receiving a compressible electrical connector, and further comprising a hollow cylindrical member having one end affixed to the back wall of said enclosure, and a banana plug having first and second ends, one end of the plug being inserted into the recess of the one member, so that the protruding end of the banana plug is received in the other end of the hollow cylindrical member when the mounting platform is pivoted toward the enclosure back wall.

12. The combination of a rectangular frame and a plurality of printed circuit boards, which frame supports the boards in abutting relationship, each board having at least one slot on each of two opposed edge portions, said frame including a pair of opposed side frame members to define a pair of generally parallel, spaced-apart mounting surfaces, each member having a base portion and a tongue extending from the base portion toward the tongue of the other side frame member, each base portion defining a series of spaced-apart openings for receiving fasteners, a pair of channel members, each generally U-shaped in cross section to receive the tongues of the side frame members in a close-tolerance fit to complete the rectangular frame, and a plurality of fasteners extending through said slots into said apertures for retaining said printed circuit boards on the rectangular frame.

13. The combination of a rectangular frame and a plurality of printed circuit boards, which frame supports the boards in abutting relationship, each board having at least one slot on each of two opposed edge portions, including a pair of opposed side frame members to define a pair of generally parallel, spaced-apart mounting surfaces, each member having a base portion and a tongue extending from the base portion toward the tongue of the other side frame member, each base portion defining a series of spaced-apart openings for receiving fasteners, a pair of channel members, each generally U-shaped in cross section to receive the tongues of the side frame members in a close-tolerance fit to complete the rectangular frame, and a plurality of fasteners extending through said slots into said apertures for retaining said printed circuit boards on the rectangular frame, in which at least some o said boards have slots of a dimension which extends sufficiently for the boards to be displaced, after loosening at least some of said fasteners, from their abutting relationship without necessitating removal of the boards from the rectangular frame.

14. The combination as claimed in claim 13, in which the openings are spaced apart by a distance approximately the width of the printed circuit boards, and said fasteners include screws extending through said slots into said apertures.

15. The combination as claimed in claim 13, and further comprising a pair of matching electrical circuit interconnectors, one disposed on each of two abutting printed circuit boards, such that when those two boards are mounted and positioned in abutting relationship, the electrical circuit components on the respective boards are intercoupled through the mating connectors.

16. The combination as claimed in claim 13, in which one of said circuit boards defines at least one additional slot, on an edge of the board which abuts an adjacent board, to allow insertion of the tip of a tool which, when rotated, displaces the adjacent circuit boards from the abutting relationship.

17. The combination as claimed in claim 13, in which each of said side frame members has its base portion defining a shoulder to locate the edges of the printed circuit boards.

18. The combination as claimed in claim 13, in which said side frame members have a central portion of the base bored to remove material therefrom and define a generally circular opening.

19. The combination as claimed in claim 13, in which the base portion of at least one of said side frame members defines at least one recess for receiving a compressible electrical connector.

20. The combination as claimed in claim 13, at least one additional printed circuit board on the back side of the frame, and electrical interconnection means coupled between said additional board and one of the boards on the front of the rectangular frame, thus intercoupling the circuits on the additional board and said one board on the front of the frame.

21. The combination as claimed in claim 13, and an enclosure for said frame, a pin fixed within the enclosure, which pin is received in the circular opening of one of said side frame members, a bracket fixed to a different surface of the enclosure, which bracket defines a circular opening, and a pin, extending through the bracket opening into the circular opening at the other end of said one side frame member, to provide a pivotal mounting for the frame in said enclosure.

22. The combination frame and enclosure as claimed in claim 21, in which the base portion of one of said side frame members defines at least one recess for receiving a compressible electrical connector, and further comprising a hollow cylindrical member having one end affixed to the back wall of said enclosure, and a banana plug having first and second ends, one end of the plug being inserted into the other end of the cylindrical member, so that the protruding end of the banana plug is received in the one recess of the one side frame member when the rectangular frame is pivoted toward the enclosure back wall.

* * * * *